United States Patent [19]

Washizuka et al.

[11] Patent Number: 4,591,994
[45] Date of Patent: May 27, 1986

[54] METHOD AND APPARATUS FOR CONTROLLING SHAPE OF SINGLE CRYSTAL

[75] Inventors: Syoichi Washizuka, Yokohama; Sadao Matsumura, Tokyo, both of Japan

[73] Assignee: Tokyo Shibaura Denki Kabushiki Kaisha, Kawasaki, Japan

[21] Appl. No.: 543,046

[22] Filed: Oct. 18, 1983

[30] Foreign Application Priority Data

Nov. 30, 1982 [JP] Japan .................. 57-208481

[51] Int. Cl.$^4$ .............. B01D 9/00; G06G 7/66; G06G 7/58
[52] U.S. Cl. .................. 364/500; 156/601; 156/617 SP; 364/162; 364/477; 422/249
[58] Field of Search ............ 156/601, 617 SP; 364/500, 161, 162, 163, 468, 469, 477; 422/108, 109, 249

[56] References Cited

U.S. PATENT DOCUMENTS

| | | | |
|---|---|---|---|
| 3,934,983 | 1/1976 | Bardsley et al. | 156/601 X |
| 4,008,387 | 2/1977 | Green et al. | 364/477 |
| 4,032,389 | 6/1977 | Joyce | 156/601 |
| 4,073,355 | 2/1978 | Schmidt et al. | 156/601 X |
| 4,234,376 | 11/1980 | Linares | 156/617 SP |
| 4,239,583 | 12/1980 | Hatch et al. | 156/601 |
| 4,258,003 | 3/1981 | Hurle et al. | 156/601 X |
| 4,397,813 | 8/1983 | Washizuka et al. | 422/249 X |

OTHER PUBLICATIONS

Japanese Utility Model Publication (Kokoku) No. 54-4345 K. Takaji et al., Mar. 6, 1979.
J. Crystal Growth 19 (1973), 187–192, A. E. Zinnes et al.
J. Crystal Growth 40 (1977) 21–28, W. Bardsley.

Primary Examiner—Gary Chin
Assistant Examiner—Edward R. Cosimano
Attorney, Agent, or Firm—Oblon, Fisher, Spivak, McClelland & Maier

[57] ABSTRACT

A method for controlling the shape of a single crystal. The weight of a single crystal pulled by the Czochralski method is detected, to obtain a weight signal W. The weight signal W is differentiated over time, to obtain a differential signal $dW/dt$. Using the differential signal $dW/dt$, $(A \cdot dW/dt + B)\theta$ is computed, to obtain an operation signal f. A and B are parameters which are determined by predetermined manufacturing conditions of the Czochralski method, and $\theta$ is a preset growing angle of the single crystal. The operation signal f is integrated over time, to obtain an integral signal F. The integral signal F and the differential signal $dW/dt$ are compared to obtain a deviation signal. The heating power supplied to the crucible is controlled by use of the deviation signal, to keep the growing angle of the single crystal constant.

12 Claims, 8 Drawing Figures

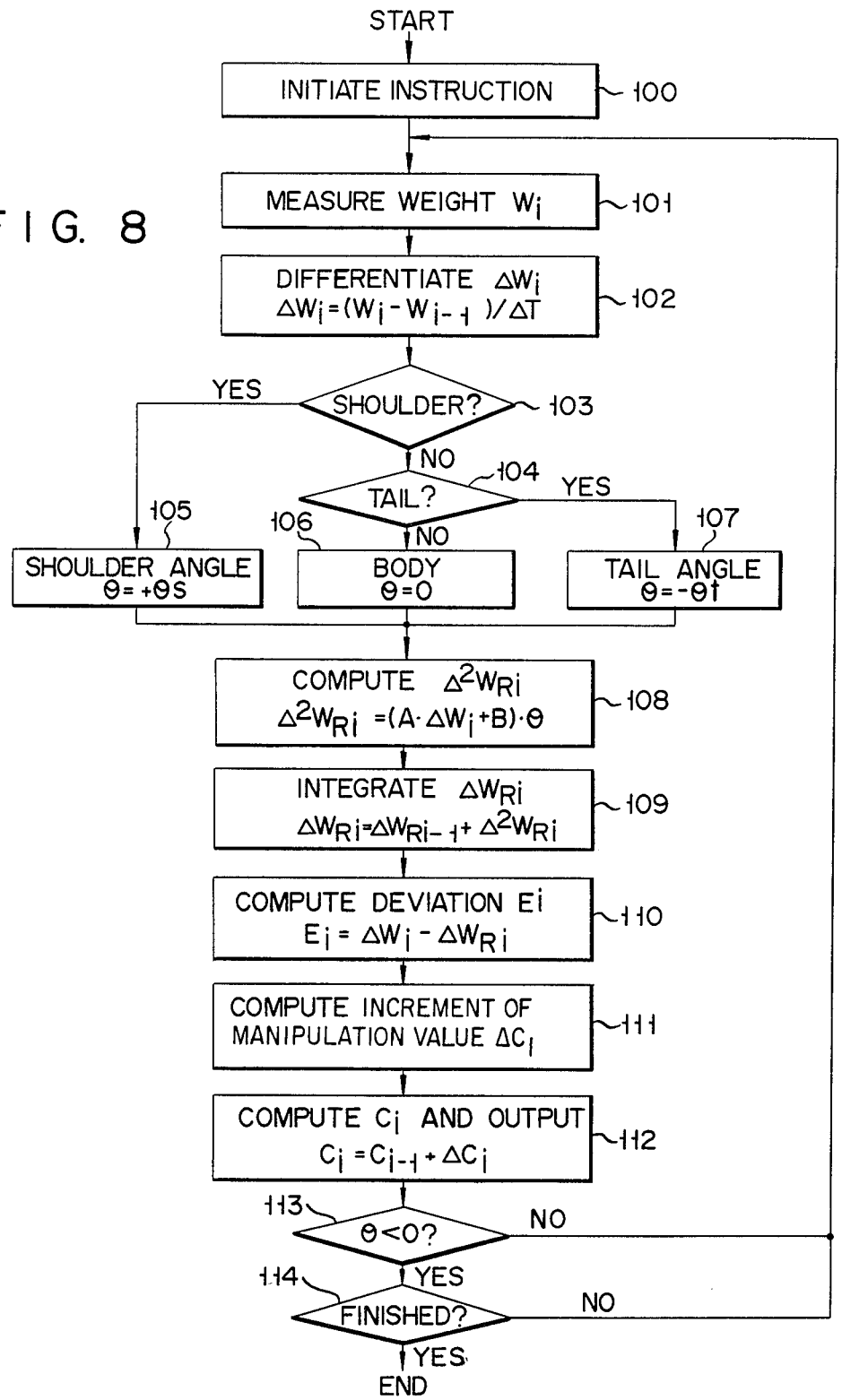

METHOD AND APPARATUS FOR CONTROLLING SHAPE OF SINGLE CRYSTAL

BACKGROUND OF THE INVENTION

The present invention relates to a method and apparatus for controlling a single crystal grown by the Czochralski method and forming said crystal into a predetermined shape.

In growing single crystals of good quality by the Czochralski method, the diameter of the crystal's body must remain constant. In addition, the shoulder section of the crystal must have a desired shape. This is particularly important in preventing strain and dislocation, as well as the formation and propagation of twins. In particular, with a III-V compound semiconductor single crystal having a zinc blend structure, many reports have been made on the shape of the crystal shoulder section and, in particular, on the relationship between the angle of the crystal shoulder section and the formation of twins. Such a report is made in, for example, W. A. Bonner: Mat. Res. Bull. 15 (1980), 63.

The crystal differential weight at the shoulder section is not constant and changes over time. Accordingly, shape control of single crystals has been conventionally effected as follows. When a single crystal having the shape shown in FIG. 1 is to be grown, its weight changes both linearly and nonlinearly, as shown in the graph of FIG. 1. The crystal weight is a cubic function of time in the nonlinear region and is a linear function of time in the linear region. To obtain the reference weight signal given in the nonlinear and linear regions, Japanese Patent Publication No. 54-4345 discloses a method for directly moving a potentiometer along a plate having a shape corresponding to the reference weight curve. Japanese Patent Publication No. 54-4345 also discloses a method of obtaining a reference weight signal by using a programmer for moving a potentiometer along a plate having a shape corresponding to a time differentiated curve of the reference weight, and by rotating a motor in such a way as to move a heliohm. Another method is disclosed by A. E. Zinnes and B. E. Nevis in "Automatic Diameter Control of Czochralski Grown Crystals" (J. Crystal Growth 19 (1973), pp. 187 to 192). According to the method of this literature, a time differentiated function of the reference weight of the crystal shoulder section is computed by a computer, as a linear function of time, and the obtained function is processed by software. By either of these methods, the reference signal is obtained as a function of time. Furthermore, these methods are both applied to growing oxide single crystals.

In the actual manufacture of single crystals, the shoulder section does not always grow uniformly after a seed crystal is dipped into a melt. For example, if the temperature at which the seed crystal is dipped into the melt is too high or too low, the pulling of the seed crystal may not easily result in the formation of crystals, or may result in the rapid growth of crystals. Accordingly, when the shape of a single crystal is controlled by the conventional method, a great offset tends to be generated. When intense control is performed to prevent such an offset, the crystal has an irregular shape at the shoulder section, resulting in an increased strain or the formation of twins. Conversely, when such an offset is allowed to remain after the control operation, deviation of the crystal shape from the desired shape increases and manufacturing precision is lowered. This is particularly so in the manufacture of a III-V compound single crystal. Thus, conventional methods do not allow for the stable formation of the shoulder section of a III-V compound single crystal of high quality. Therefore, conventional methods cannot be applied to the manufacture of III-V compound single crystals having a large diameter and a large volume, such as InSb, GaAs and InP, which are receiving attention as single crystals suitable for use in infrared ray CCDs, ultra high-speed ICs, and FETs.

SUMMARY OF THE INVENTION

A primary object of the present invention is to provide a method for growing a single crystal, having a desired shape, with precision and stability.

Another object of the present invention is to provide an apparatus for growing a single crystal having a desired shape, with precision and stability.

These and other objects have been attained by the method of the present invention for controlling the shape of a single crystal, which comprises the steps of detecting the weight of a single crystal pulled in accordance with the Czochralski method, to obtain a weight signal W, differentiating the weight signal W of the single crystal over time, to obtain a differential signal $dW/dt$, computing $(A \cdot dW/dt + B)\theta$, using the differential signal $dW/dt$, to obtain an operation signal f, where A and B are parameters determined by predetermined manufacturing conditions of the Czochralski method, respectively, and $\theta$ is a preset growing angle of the single crystal, integrating the operation signal f over time, to obtain an integral signal F, comparing the integral signal F and the differential signal $dW/dt$ to obtain a deviation signal, and controlling heating power supplied to a crucible, using the deviation signal, to keep the growing angle of the single crystal constant.

According to the method of the present invention; as described above, a reference signal for growing a single crystal can be determined in accordance with the actual growing states of the single crystal. The method of the present invention has the following advantages:

(a) In growing the shoulder section of a single crystal, the shape of this section can be controlled with excellent precision and stability.

(b) This method allows for easier tracking of changes in crystal growing conditions than do conventional control methods. The offset from a desired shape is as small as about 1/5 that which occurs in a conventional method. The deviation from the linear growing angle at the shoulder section can be kept within a range of ±1°.

(c) When the method of the present invention was applied to the manufacture of III-V compound single crystals, no twins were formed at the shoulder, and a high yield of 70% or more was obtained.

(d) The method of the present invention allows for the completely automatic manufacture of single crystals having a predetermined shape, thus providing good industrial applicability and a better yield.

According to the present invention, an apparatus for controlling the shape of a single crystal is also provided, which comprises a device for pulling a single crystal in accordance with the Czochralski method, an element for detecting the weight of the pulled single crystal, to obtain a weight signal W, a differentiating circuit for differentiating the weight signal W of the single crystal over time, to obtain a differential signal $dW/dt$, an operation circuit for computing $(A \cdot dW/dt + B)\theta$ by use of the differential signal dW/dt, to obtain an operation signal f, where A and B are parameters which are determined by predetermined manufacturing conditions of the Czochralski method, and $\theta$ is a preset growing angle of the single crystal, an integrating circuit for integrating the operation signal f over time, to obtain an integral signal F, a deviation detector for comparing the integral signal F and the differential signal dW/dt, to obtain a deviation signal, and a control circuit for controlling the heating power supplied to a crucible by use of the deviation signal, to keep the growing angle of the single crystal constant.

BRIEF DESCRIPTION OF THE DRAWINGS

Other objects and advantages of the invention will be apparent from the following description, in conjunction with the accompanying drawings, in which:

FIG. 8 is a flow chart of a program to be executed by the apparatus shown in FIG. 7.

DETAILED DESCRIPTION OF THE EMBODIMENTS

Having studied the problems concerning the conventional methods described above, the present inventors have concluded that such problems are attributable to the fact that a reference signal is determined solely as a function of time, and that the reference signal must be re-evaluated in accordance with the actual growing states of the single crystal. A time differential (dW/dt) of the weight of a crystal growing to a diameter of 2r is given by the equation:

$$dW/dt = \pi\rho_s r^2 v = \pi\rho_s r^2 H/(1 - \rho_s r^2/\rho_l R^2) \tag{1}$$

where $\rho_s$ and $\rho_l$ are densities of the crystal and the melt, respectively, H is a pulling speed, R is a radius of the crucible used, and v is a crystal growing velocity. Differentiation over time and re-arrangement of the terms of equation (1) yield the equation:

$$d^2W/dt^2 = dW/dt\{(2/r)dr/dt + (1/v)dv/dt\} \tag{2}$$

Figure 1:
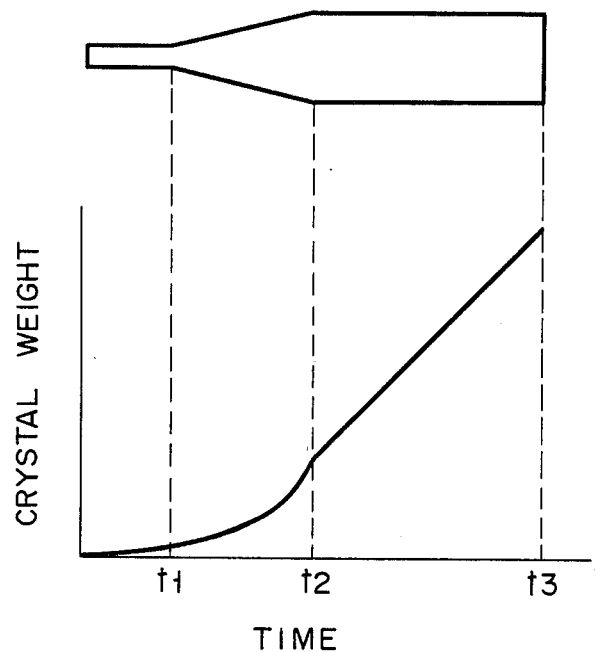
FIG. 1 is a graph showing the relationship between a crystal's shape and weight.
Figure 2:
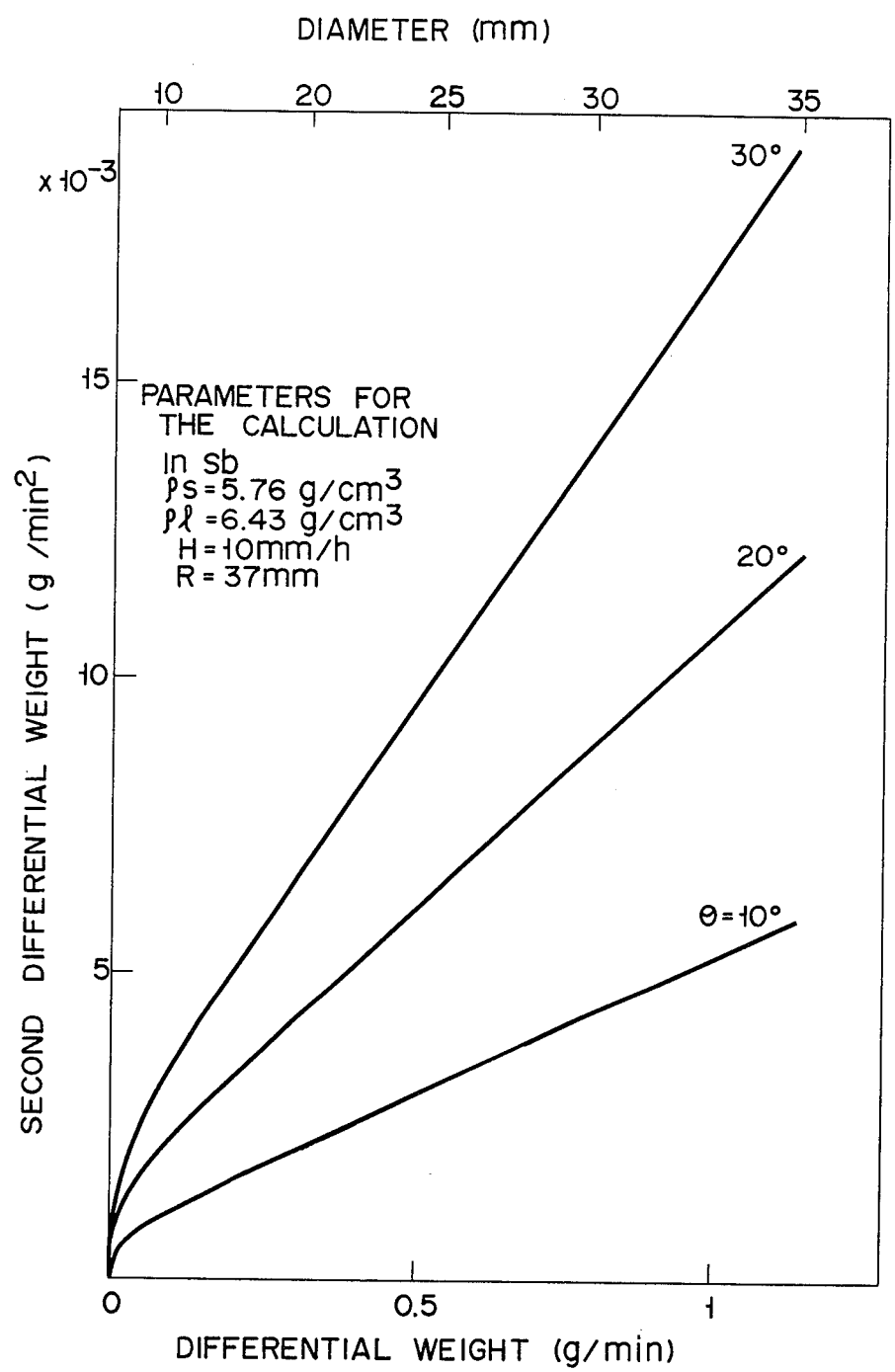
FIG. 2 is a graph showing the relationship between the second differential weight and the differential weight of a single crystal, using the shoulder growing angle $\theta$ of the crystal as a parameter.

The equation (2) above indicates that the second differential ($d^2W/dt^2$) of the weight of the crystal can be determined by dW/dt, the rate of change of the crystal diameter and the rate of change of the growing velocity. The relationship between the first differential dW/dt of the weight and the second differential $d^2W/dt^2$ of the weight was computed by using the linear growing angle $\theta$ at the shoulder section as a parameter. The results shown in FIG. 2 were thus obtained. The curve shown in FIG. 2 can be roughly approximated by the following equation (3), excluding a region in which the crystal diameter is extremely small:

$$d^2W/dt^2 = (A \cdot dW/dt + B)\theta \tag{3}$$

where A and B are parameters determined by $\rho_s$, $\rho_l$, H and R. The above equation (3) provides the necessary rate of change of the crystal weight, to keep the shoulder growing angle from the current diameter constant. Thus, when the value of dW/dt is measured during pulling and the $d^2W/dt^2$ given by the equation (3) is integrated, the reference value of dW/dt can be automatically determined in accordance with the actual growing states of the single crystal and independently of time. When control of the shape at the shoulder section of the single crystal was performed by use of this reference signal, no offset was produced and the precision of shape control was improved.

Figure 3:
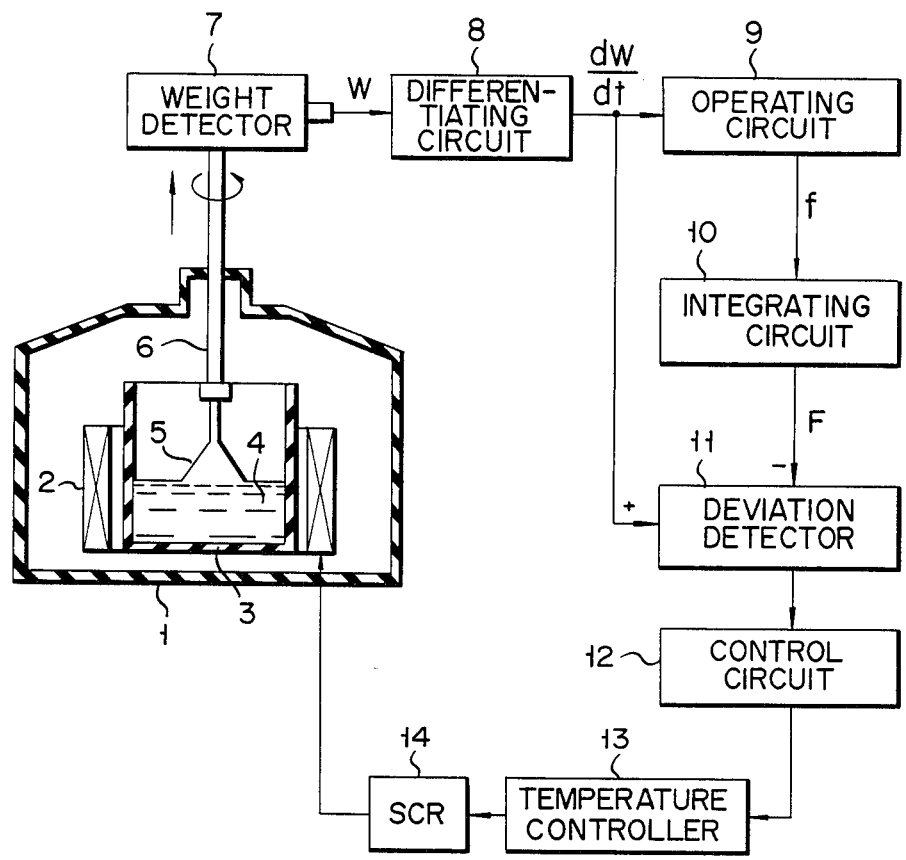
FIG. 3 is a block diagram of an apparatus for controlling the shape of a single crystal according to an embodiment of the present invention.
Figure 5:
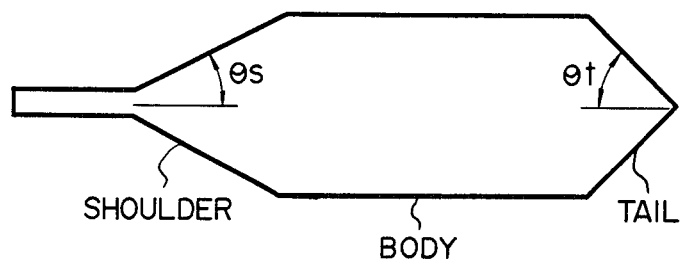
FIG. 5 is a schematic diagram showing the shape of a single crystal.

FIG. 3 shows an apparatus for controlling the shape of a single crystal according to an embodiment of the present invention. A device for pulling a single crystal by the Czochralski method comprises a vessel 1, a heater 2, a crucible 3, a melt 4, a crystal 5 and a pulling shaft 6. A weight detector 7 for detecting the crystal weight is mounted on top of the pulling shaft 6. The weight detector 7 comprises a load cell and produces a weight signal W. The weight signal W from the weight detector 7 is supplied to a differentiating circuit 8 and is differentiated, over time, to provide a differential signal dW/dt. The differential signal dW/dt from the differentiating circuit 8 is supplied to an operating circuit 9, in such a way as to compute $(A \cdot dW/dt + B)\theta$. The term $(A \cdot dW/dt + B)\theta$ corresponds to the rate of change of the differential signal dW/dt, i.e., to a second differential signal $d^2W/dt^2$. The operating circuit 9 produces an operation signal f which is supplied to an integrating circuit 10. The integrating circuit 10 integrates the operation signal f over time and produces an integral signal F. The integral signal F from the integrating circuit 10 is supplied to a deviation detector 11 and is compared thereby with the differential signal dW/dt. The deviation detector 11 produces a deviation signal corresponding to the difference between the integral signal F and the differential signal dW/dt. The deviation signal is supplied to a control circuit 12 which produces a heating power control signal for controlling heating power for heating the crucible 3. The heating power control signal is supplied to a temperature controller 13 which drives a heating device 14 for controlling the heating power. Thus, the shape of the single crystal is controlled in this manner.

Figure 4:
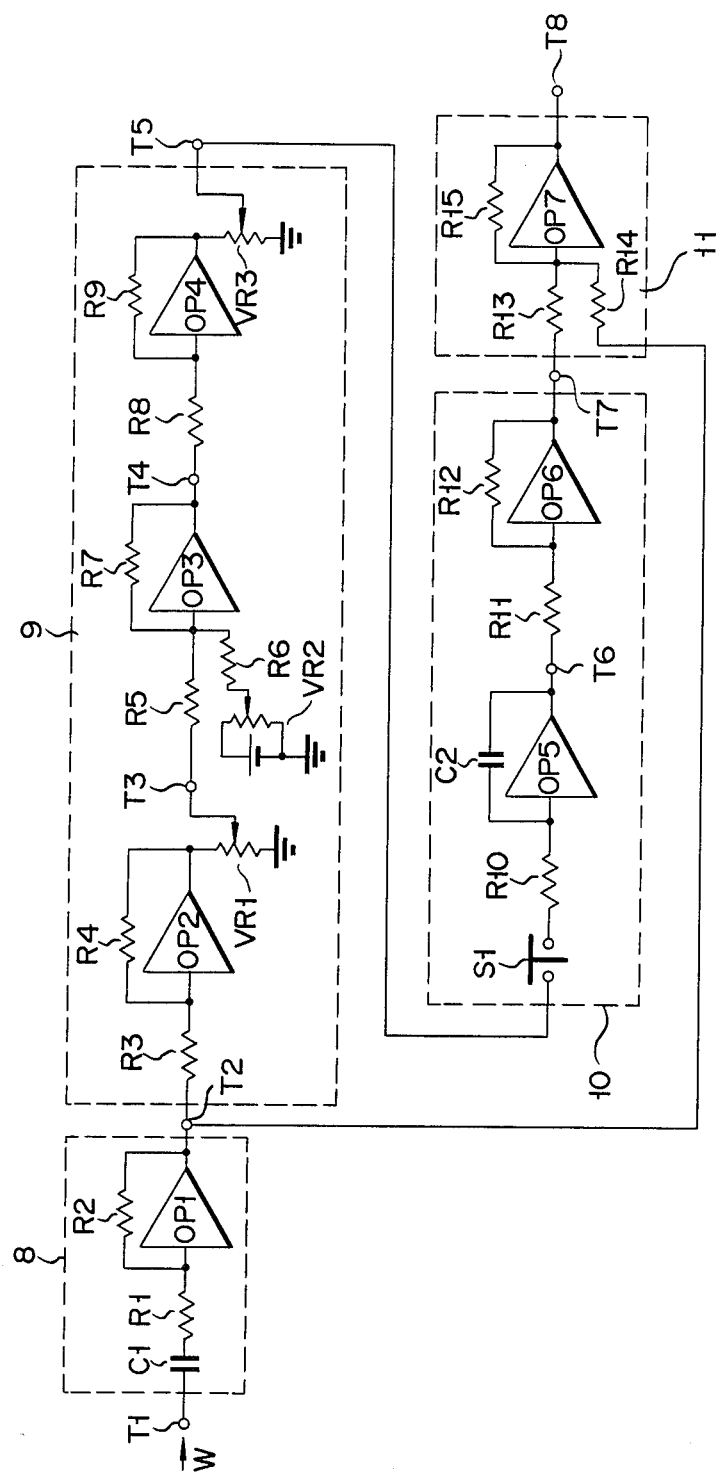
FIG. 4 is a composite circuit diagram including examples of a differentiating circuit, an operating circuit, an integrating circuit and a deviation detector, which are used in the apparatus shown in FIG. 3.

The differentiating circuit 8, the operating circuit 9, the integrating circuit 10 and the deviation detector 11, which are the basic components of the apparatus of the present invention; have, e.g., the configuration shown in FIG. 4. The differentiating circuit 8 comprises a first capacitor C1, a first operational amplifier OP1, and first and second resistors R1 and R2. The first capacitor C1 and the first resistor R1 are series-connected between a terminal T1 for receiving the weight signal W, and the input terminal of the first operational amplifier OP1. The second resistor R2 is connected between the input and output terminals of the first operational amplifier OP1. A differential signal $-dW/dt$ is produced from a terminal T2 connected to the output terminal of the first operational amplifier OP1.

The operating circuit 9 comprises third to ninth resistors R3 to R9; second to fourth operational amplifiers OP2, OP3 and OP4; and first to third potentiometers VR1, VR2 and VR3. The input terminal of the second operational amplifier OP2 is connected to terminal T2 through the third resistor R3. The input and output terminals of the second operational amplifier OP2 are connected through the fourth resistor R4. The first potentiometer VR1 is connected between a terminal T3 and the output terminal of the second operational amplifier OP2. A signal $+A(dW/dt)$ appears at terminal T3. Parameter A is set by adjusting the potentiometer VR1. The input terminal of the third operational amplifier OP3 is connected to the terminal T3 through resistor R5, and is also connected to the second potentiometer VR2 through resistor R6. Resistor R7 is connected between the input and output terminals of the third operational amplifier OP3. A signal $-(A \cdot dW/dt + B)$ appears at a terminal T4 connected to the output terminal of the third operational amplifier OP3. Parameter B can be preset by adjusting the second potentiometer VR2. The input terminal of the fourth operational amplifier OP4 is connected to the terminal T4 through the resistor R8. The resistor R9 is connected between the input and output terminals of the fourth operational amplifier OP4. The output terminal of the fourth operational amplifier OP4 is connected to a terminal T5 through the third potentiometer VR3. A signal $+(A \cdot dW/dt + B)\theta$ appears at terminal T5. Parameter $\theta$ represents the growing angle $\theta_s$ of the shoulder section of the single crystal, or the growing angle $\theta_t$ of the tail section thereof. Parameter $\theta$ can be preset by adjusting the third potentiometer VR3.

The integrating circuit 10 comprises fifth and sixth operational amplifiers OP5 and OP6, tenth to twelfth resistors R10 to R12, a second capacitor C2, and a switch S1. The input terminal of operational amplifier OP5 is connected to the first terminal of the switch S1, through resistor R10, and is also connected to the output terminal of operational amplifier OP5, through the second capacitor C2. The second terminal of the switch S1 is connected to terminal T5. A signal $-\int (A \cdot dW/dt + B)\theta dt$ appears at a terminal T6 which is connected to the output terminal of operational amplifier OP5. The input terminal of operational amplifier OP6 is connected to this terminal T6 through resistor R11, and is also connected to the output terminal of the operational amplifier OP6, through resistor R12. A signal $+\int (A \cdot dW/dt + B)\theta dt$ appears at a terminal T7 which is connected to the output terminal of operational amplifier OP6.

The deviation detector 11 comprises thirteenth to fifteenth resistors R13 to R15 and a seventh operational amplifier OP7. The input terminal of the operational amplifier OP7 is connected to terminal T7 through resistor R13, to terminal T2 through resistor R14, and to the output terminal of the operational amplifier OP7 through resistor R15, respectively. A signal $dW/dt - \int (A \cdot dW/dt + B)\theta dt$ appears at a terminal T8 which is connected to the output terminal of operational amplifier OP7.

The switch S1 in the integrating circuit 10 serves to halt the operation of the integrating circuit 10 and to keep its output constant. When the switch S1 is open, the shape of the growing single crystal can be changed from that of the shoulder section to that of the body section.

A case may now be described wherein an InSb single crystal (III-V compound single crystal) is manufactured by using the apparatus having the functions described above. Referring to FIG. 3, an InSb polycrystalline raw material was charged in the amount of 500 g in a crucible 3 having a diameter of 74 mm. The crucible 3 was heated to 650° C. A seed crystal having (211) crystal axes was rotated at 10 rpm and was brought into contact with a melt 4 of the InSb crystal. The seed crystal was then pulled at a velocity of 10 mm/h. Parameters A and B in the equation (3) above at this time were $4.77 \times 10^{-4}$/min·deg and $6.65 \times 10^{-5}$ g/min²·deg, respectively. Shape control of the shoulder section of the growing crystal was commenced after setting the angle $\theta$ at 15°. When the crystal diameter reached 35 mm, the switch S1 was opened to fix the output from the integrating circuit 10. Thereafter, the pulling of the body of the crystal was performed to provide an InSb single crystal weighing up to 450 g. The obtained single crystal had a linear growing angle at the shoulder section of up to 14.5°, a smooth surface, and contained no twin.

The manufacturing process of InSb single crystals was repeated ten times by the above control method. The deviation in the angle $\theta$ was within the range of $\pm 1°$ in each case, with eight single crystals being satisfactory and having no twin.

Figure 6:
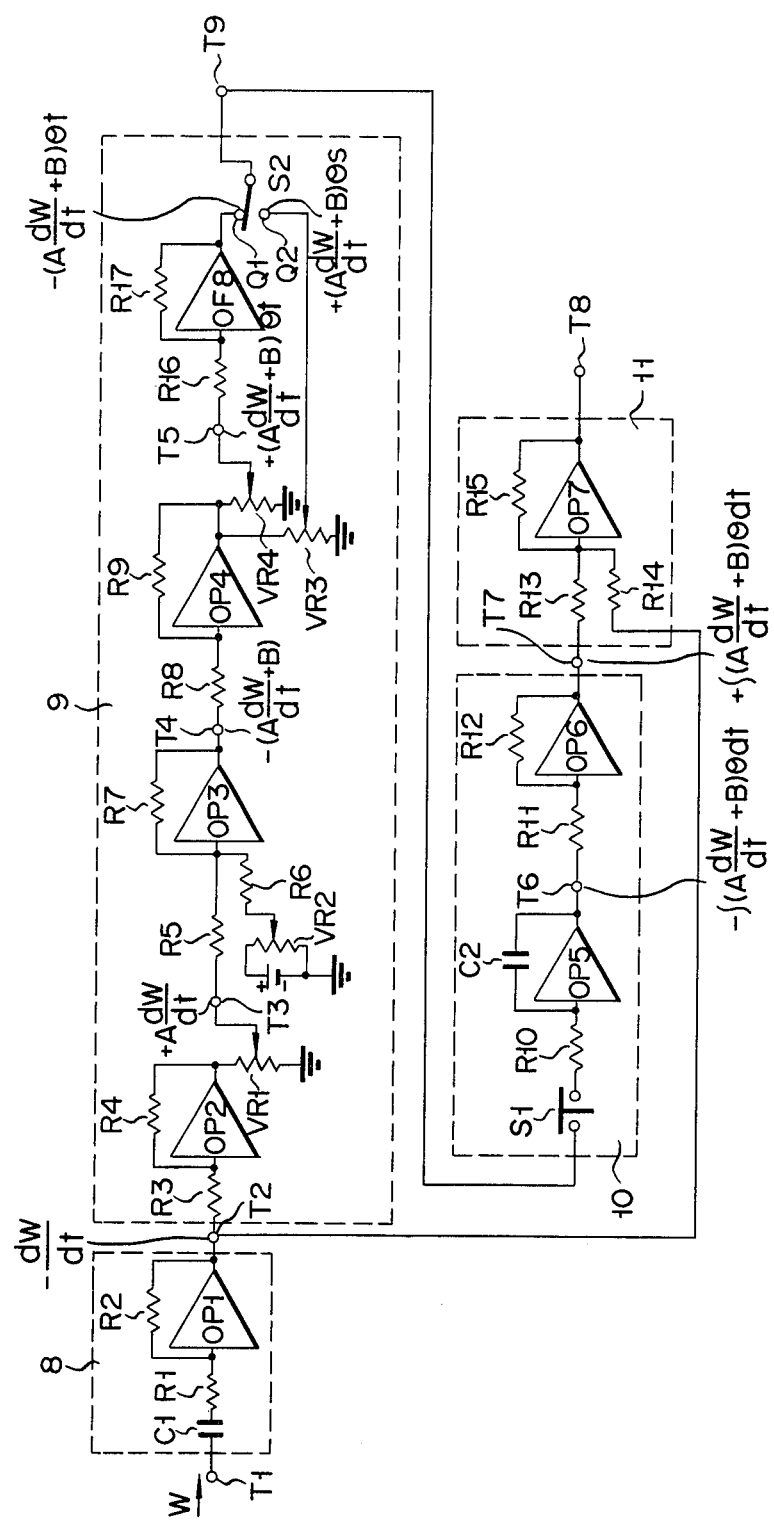
FIG. 6 is a circuit diagram of other examples of a differentiating circuit, an operating circuit, an integrating circuit and a deviation detector, each of which are also used in the apparatus shown in FIG. 3.

To manufacture a single crystal by a series of steps, after setting two angles $\theta_s$, $\theta_t$ for the shoulder section and the tail section of the single crystal, respectively, the operating circuit 9 must have the configuration shown in FIG. 6. More specifically, a fourth potentiometer VR4 is connected to the output terminal of the operational amplifier OP4, in parallel with the potentiometer VR3. The terminal T5 is connected to the input terminal of an eighth operational amplifier OP8 through a sixteenth resistor R16. The input terminal of the operational amplifier OP8 is connected to an output terminal thereof and to a first terminal Q1 of a switch S2 through a seventeenth resistor R17. The output terminal of the potentiometer VR3 is connected to a second terminal Q2 of the switch S2. The common terminal of the switch S2 is connected to the input terminal of the integrating circuit 10 through a terminal T9. Since the remaining portion of the circuitry remains the same as that shown in FIG. 4, a detailed description thereof will be omitted.

In the above circuitry shown in FIG. 6, in the first step, the common terminal of the switch S2 is connected to the terminal Q2. The angle $\theta$ is set at $\theta_s$ by the potentiometer VR3 and the single crystal is pulled by the Czochralski method. In this step, the shoulder section of the single crystal is formed. After a predetermined time interval has elapsed, the switch S1 of the integrating circuit 10 is opened. Since the output from the integrating circuit 10 is then kept constant, the angle $\theta$ is kept at $\theta$ and the body section of the single crystal is formed. After another predetermined time interval has elapsed, the switch S1 of the integrating circuit 10 is closed, and the switch S2 of the operating circuit 9 is switched to the terminal Q1. Thus, an output signal from the operational amplifier OP8 is supplied to the terminal T9. The signal appearing at the terminal T9 is $-(A \cdot dW/dt + B)\theta$ and indicates that the angle $\theta$ is set at a negative value. The angle $\theta$ is then set at $\theta_t$ by adjusting the potentiometer VR4. In this manner, a single crystal having a shoulder section, a body section and a tail section can be grown by a series of steps.

An apparatus using a computer according to another embodiment of the present invention may now be described with reference to FIG. 7. A weight signal W from a weight detector 7 comprising, e.g., a load cell, is supplied to an A/D converter 21 through a preamp 20 and is converted to a digital weight signal $W_i$. The digital weight signal $W_i$ is supplied to an operating circuit 23 through an input unit 22. Operating circuit 23 performs a differentiation operation, an algebraic operation, an integration operation, a comparison operation and a manipulation value operation. The operating circuit 23 comprises a CPU 24, a RAM 25, a ROM 26 and a timer 27. The ROM 26 stores an operation program or parameters A, B and $\theta$ of the equations (3) above. The RAM 25 stores the digital weight signal $W_i$ and the operation results of the CPU 24. Using the data in the RAM 25, the CPU executes an operation in accordance with the operation program read out from the ROM 26. The timer 27 counts the operation time for growing each of the shoulder section, the body section and the tail section. An output signal from the operating circuit 23 is supplied to a D/A converter 29 through an output unit 28 and is converted into an analog signal. The analog signal is supplied to a temperature controller 30, to control power to be supplied to a heater 31 of the single crystal pulling device.

Figure 7:
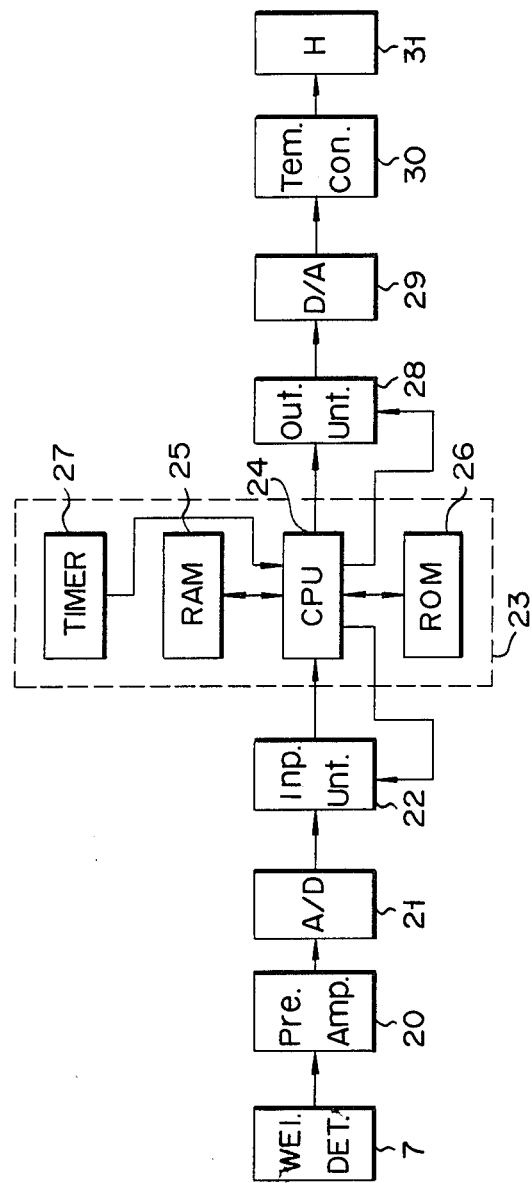
FIG. 7 is a block diagram showing an apparatus for controlling the shape of a single crystal according to another embodiment of the present invention.

FIG. 8 is a flow chart of the program executed by the apparatus shown in FIG. 7. This control operation is performed at constant intervals. In step 100, an initiate instruction for initializing the program is set. In step 101, the weight $W_i$ of the single crystal is measured. In step 102, differentiation is performed, utilizing the previous weight $W_{i-1}$, to compute a differential $\Delta W_i$. The growing states of the crystal are checked in steps 103 and 104, and the flow branches to steps 105 to 107. In steps 105 to 107, the value of the angle $\theta$ is set. When the shoulder section is to be formed, the angle $\theta$ is set at $+\theta_s$. When the body section is to be formed, the angle $\theta$ is set at 0. When the tail section is to be formed, the angle $\theta$ is set at $-\theta_t$. In step 108, the increment $\Delta^2 W_{Ri} = (A\Delta W_i + B)\theta$ is computed. In step 109, the term $\Delta^2 W_{Ri}$ is integrated to automatically derive the reference value $\Delta W_{Ri}$ of the term $\Delta W_i$. In step 110, the deviation $E_i$ ($E_i = \Delta W_i - \Delta W_{Ri}$) between the reference value $\Delta W_{Ri}$ thus determined and the actual rate of change $\Delta W_i$ of the weight of the crystal is computed. In step 111, the increment $\Delta C_i$ of the manipulation value of the heating power is computed so as to make the deviation $E_i$ equal to 0. This increment can be computed by a velocity-type PID (proportional-plus-integral-plus-derivative) control equation, cf. equation 10 of Zinnes et al, "AUTOMATIC DIAMETER CONTROL OF CZOCHRALSKI GROWN CRYSTALS", *Journal of crystal Growth*, 19 (1973) 187–192. In step 112, the manipulation value $C_i$ of the heating power of the single crystal pulling device is computed. The manipulation value $C_i$ is supplied to the temperature controller to control the melt temperature. In step 113, whether or not the crystal section currently being grown is a tail section is confirmed. If a YES is indicated in step 113, whether or not crystal growing process is complate is then comfirmed in step 114. If YES is indicated in step 114, necessary procedures, such as that for the cutting of the crystal or gradual cooling, are performed to end the program. If a NO is indicated in steps 113 and 114, the flow returns to step 101.

According to the method of the present invention, the shape of the single crystal can be controlled with a high degree of precision, so that a single crystal of high quality can be manufactured with a good yield.

Here, it should be noted that the method of the present invention can be similarly applied to other III-V compound single crystals such as GaAs, GaSb, InP or GaP crystals, or to oxide single crystals, by appropriately determining the parameters A, B of the equation (3), in accordance with the pulling conditions.

What is claimed is:

1. A method for controlling the shape of a single crystal, comprising the steps of:
   detecting the weight of a single crystal pulled by the Czochralski method, to obtain a weight signal W;
   differentiating the weight signal W of the single crystal over time, to obtain a differential signal dW/dt;
   computing $(A \cdot dW/dt + B)\theta$ by use of the differential signal dW/dt, to obtain an operation signal f, where A and B are parameters which are determined in accordance with predetermined manufacturing conditions of the Czochralski method, respectively, and $\theta$ is a preset growing angle of the single crystal;
   integrating the operation signal f over time, to obtain an integral signal F;
   comparing the integral signal F and the differential signal dW/dt, to obtain a deviation signal; and
   controlling heating power supplied to a crucible using the deviation signal, to keep the growing angle of the single crystal constant.

2. A method according to claim 1, wherein the growing angle $\theta$ of the single crystal is changed over time, to obtain the single crystal of a desired shape.

3. A method for controlling the shape of a single crystal, comprising the steps of:
   detecting the weight of a single crystal pulled by the Czochralski method, to obtain a weight signal W;
   differentiating the weight signal W of the single crystal over time, to obtain a differential signal dW/dt;
   setting the growing angle of the single crystal at $\theta_1$ ($>0$) and computing $(A \cdot dW/dt + B)\theta_1$ by use of the differential signal dW/dt, to obtain an operation signal $f_1$, where A and B are parameters which are determined in accordance with predetermined manufacturing conditions of the Czochralski method, respectively;
   integrating the operation signal $f_1$ over time, to obtain an integral signal $F_1$;
   comparing the integral signal $F_1$ and the differential signal dW/dt, to obtain a first deviation signal;
   controlling heating power supplied to a crucible by use of the first deviation signal, to keep the growing angle of the single crystal at $\theta_1$:
   setting the integral signal $F_1$ at a fixed value and comparing the differential signal dW/dt and the fixed value of the integral signal $F_1$, to obtain a second deviation signal;
   controlling the heating power supplied to the crucible, by use of the second deviation signal, thereby setting the growing angle of the single crystal at 0 and keeping the diameter of the single crystal constant;
   setting the growing angle of the single crystal at $\theta_2$ ($>0$) and computing $(A \cdot dW/dt + B)\theta_2$, to obtain an operation signal $f_2$;
   integrating the operation signal $f_2$ over time, to obtain an integral signal $F_2$;

comparing the integral signal $F_2$ and the differential signal dW/dt, to obtain a third deviation signal; and controlling the heating power supplied to the crucible using the third deviation signal, to keep the growing angle of the single crystal at $\theta_2$.

4. An apparatus for controlling the shape of a single crystal, comprising:

a device for pulling the single crystal by the Czochralski method;

means for detecting the weight of a pulled single crystal, to generate a weight signal W;

differentiating circuit means for differentiating the weight signal W of the single crystal over time, to obtain a differential signal dW/dt;

operating circuit means for computing $(A \cdot dW/dt + B)\theta$, by use of the differential signal dW/dt, to generate an operation signal f, where A and B are parameters which are determined by predetermined manufacturing conditions of the Czochralski method, and $\theta$ is a preset growing angle of the single crystal;

integrating circuit means for integrating the operation signal f over time, to generate an integral signal F;

deviation detector means for comparing the integral signal F and the differential signal dW/dt, to generate a deviation signal; and controlling means for controlling heating power supplied to said device in accordance with the deviation signal, to keep the growing angle of the single crystal constant.

5. An apparatus according to claim 4, wherein said differentiating circuit means includes:

a capacitor which receives the weight signal at one terminal thereof;

a resistor connected at one end thereof in series with said capacitor;

an operational amplifier having an input terminal connected to the other end of said resistor; and a resistor connected between the input terminal and an output terminal of said operational amplifier.

6. An apparatus according to claim 4, wherein said integrating circuit means includes:

switch means having one terminal connected to an output terminal of said operating circuit means;

a first operational amplifier having an input terminal connected to the other terminal of said switch means, through a first resistor;

a first capacitor connected between the input terminal and an output terminal of said first operational amplifier;

a second operational amplifier having an input terminal connected to the output terminal of said first operational amplifier, through a second resistor; and a third resistor connected between the input terminal and an output terminal of said second operational amplifier.

7. An apparatus according to claim 4, wherein said deviation detector means includes:

an operational amplifier having an input terminal connected to an output terminal of said integrating circuit means through a first resistor, as well as to an output terminal of said differentiating circuit means through a second resistor; and a third resistor connected between an output terminal and the input terminal of said operational amplifier.

8. An apparatus according to claim 4, wherein said operating circuit means includes:

a first operational amplifier having an input terminal connected to an output terminal of said differentiating circuit, through a first resistor;

a second resistor connected between the input terminal and an output terminal of said first operational amplifier;

first potentiometer means connected to the output terminal of said first operational amplifier;

a second operational amplifier having an input terminal connected to an output terminal of said first potentiometer means, through a third resistor, and connected to second potentiometer means through a fourth resistor;

a fifth resistor connected between an output terminal and the input terminal of said second operational amplifier;

a third operational amplifier having an input terminal connected to the output terminal of said second operational amplifier, through a sixth resistor;

a seventh resistor connected between an output terminal and the input terminal of said third operational amplifier; and third potentiometer means connected to the output terminal of said third operational amplifier.

9. An apparatus according to claim 8, wherein said operating circuit means further comprises:

fourth potentiometer means connected to the output terminal of said third operational amplifier in parallel with said third potentiometer means;

a fourth operational amplifier having an input terminal connected to the output terminal of said fourth potentiometer means through an eighth resistor;

a ninth resistor connected between the input terminal and an output terminal of said fourth operational amplifier; and three-terminal switch means having two terminals for switching between the output terminal of said fourth operational amplifier and the output terminal of said third potentiometer means, respectively, the remaining terminal of said switch means producing the operating signal f of said operating circuit means.

10. An apparatus according to claim 9, wherein said integrating circuit means includes:

switch means having one terminal connected to the output terminal of said three-terminal switch means;

a fifth operational amplifier having an input terminal connected to the other terminal of said switch means through a tenth resistor;

a capacitor connected between the input terminal and an output terminal of said fifth operational amplifier;

a sixth operational amplifier having an input terminal connected to the output terminal of said fifth operational amplifier through an eleventh resistor; and a twelfth resistor connected between the input terminal and an output terminal of said sixth operational amplifier.

11. An apparatus according to claim 10, wherein said deviation detector means includes:

a seventh operational amplifier having an input terminal connected to the output terminal of said sixth operational amplifier through a thirteenth resistor, and to the output terminal of said differentiating circuit through a fourteenth resistor; and a fifteenth resistor connected between an output terminal and the input terminal of said seventh operational amplifier.

12. An apparatus for controlling the shape of a single crystal, comprising:
   a device for pulling the single crystal by the Czochralski method;
   means for detecting the weight of a pulled single crystal, to obtain a weight signal W;
   A/D converting means for converting the weight signal of the single crystal into a digital weight signal $W_i$;
   differentiating circuit means for differentiating the digital weight signal $W_i$ of the single crystal over time, to obtain a differential signal $\Delta W_i$;
   operating circuit means for computing $(A \cdot \Delta W_i + B)\theta$ by use of the differential signal $\Delta W_i$, to generate an operation signal $\Delta^2 W_{Ri}$, where A and B are parameters which are determined by predetermined manufacturing conditions of the Czochralski method, and $\theta$ is a preset growing angle of the single crystal;
   integrating circuit means for integrating the operation signal $\Delta^2 W_{Ri}$ over time, to generate an integral signal $\Delta W_{Ri}$;
   deviation detector means for comparing the integral signal $\Delta W_{Ri}$ and the differential signal $\Delta W_i$, to generate a deviation signal;
   control signal generating means for generating a control signal by use of the deviation signal, to control heating power supplied to a crucible of said pulling device;
   D/A converting means for converting the control signal into an analog control signal; and
   control means for supplying the analog control signal to said pulling device to control the heating power supplied thereto.

* * * * *